(12) United States Patent
Lorenz

(10) Patent No.: US 7,403,052 B1
(45) Date of Patent: Jul. 22, 2008

(54) POWER-ON DETECT BY MEASURING THERMAL VOLTAGE

(75) Inventor: Perry Scott Lorenz, Fort Collins, CO (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 11/542,323

(22) Filed: Oct. 2, 2006

(51) Int. Cl.
*H03L 7/00* (2006.01)

(52) U.S. Cl. .................... 327/143; 327/142; 327/198

(58) Field of Classification Search .............. 327/143, 327/198
See application file for complete search history.

(56) References Cited

U.S. PATENT DOCUMENTS

| | | | |
|---|---|---|---|
| 6,184,701 B1 * | 2/2001 | Kim et al. ............... | 326/21 |
| 6,563,369 B1 * | 5/2003 | Comer et al. ............. | 327/538 |
| 6,901,022 B2 * | 5/2005 | Fiscus ................... | 365/189.09 |
| 7,157,947 B2 * | 1/2007 | Chansungsan et al. ...... | 327/143 |
| 2005/0277241 A1 * | 12/2005 | Watanabe et al. .......... | 438/200 |

OTHER PUBLICATIONS

"LM88 Factory Programmable Dual Remote-Diode Thermostat," *National Semiconductor Corporation*, www.national.com, Aug. 2001, pp. 1-9.

"LM56 Dual Output Low Power Thermostat," *National Semiconductor Corporation*, www.national.com, Jan. 2006, pp. 1-13.

"LM26 SOT-23, ±3° C. Accurate, Factory Preset Thermostat," *National Semiconductor Corporation*, www.national.com, Feb. 2006, pp. 1-9.

"LM27 SOT-23, ±3° C. Accurate, 120° C.-150° C. Factory Preset Thermostat," *National Semiconductor Corporation*, www.national.com, Sep. 2006, pp. 1-9.

* cited by examiner

*Primary Examiner*—N. Drew Richards
*Assistant Examiner*—John W Poos
(74) *Attorney, Agent, or Firm*—Brett A. Hertzberg; Merchant & Gould

(57) ABSTRACT

A power-on detection circuit is arranged to cooperate with a thermal-voltage generator to determine when predictable circuit operation is achieved. The power-on detection circuit includes a comparator circuit and an inverter circuit. A power-on reset (POR) signal is generated by the inverter circuit, which evaluate an output of the comparator circuit. The comparator circuit includes a differential pair arrangement that is imbalanced with a resistor. The differential pair in the comparator circuit is arranged to determine when the thermal voltage has reached a desired target level by evaluating two points within the thermal-voltage generator circuit. The comparator circuit can have a target level that is below 100% of full operation to improve reliability.

20 Claims, 4 Drawing Sheets

US 7,403,052 B1

POWER-ON DETECT BY MEASURING THERMAL VOLTAGE

FIELD OF THE INVENTION

The present invention relates to the field of electronic circuits. More particularly, the present invention is related to a technique for determining when a thermal voltage reaches a prescribed operational threshold such that various circuits are deemed functional.

BACKGROUND

Typical microelectronic systems have various electronic components that often share one or more common biasing circuits. Examples of circuits that have common biasing arrangements include current sources, operational amplifiers, comparators, as well as other various analog and digital functions. The various circuit functions operate in a predictable fashion when the biasing circuits reach steady-state operation. However, stable operation of the various circuit functions can be delayed as a result of start-up transients and other conditions that occur when power is initially applied to the circuit. In digital circuits, it is possible that a digital logic circuit may find a trapped state or other undetermined condition during power-up. Similarly, analog circuits may reach a condition where transistors lock themselves in an off condition during power.

Various power-on detector circuits are used in electronic systems to ensure that a stable operating power-up condition has been achieved. Start-up circuits and power-on reset (POR) circuits can be used to initialize circuits and otherwise stabilize the operating conditions of various circuits. A POR signal is often asserted during an initial power-up sequence until some minimal operational criteria is achieved. Logic initialization problems can be avoided by incorporating reset circuits that are held active while a POR signal is asserted. Also, one or more nodes in various circuits can be initialized to a desired operation condition while the POR signal is asserted. Once the POR signal changes states, the various circuit functions can be presumed to be operating in a predictable fashion.

BRIEF DESCRIPTION OF THE DRAWINGS

Non-limiting and non-exhaustive embodiments are described with reference to the following drawings.

DETAILED DESCRIPTION

Figure 1A:
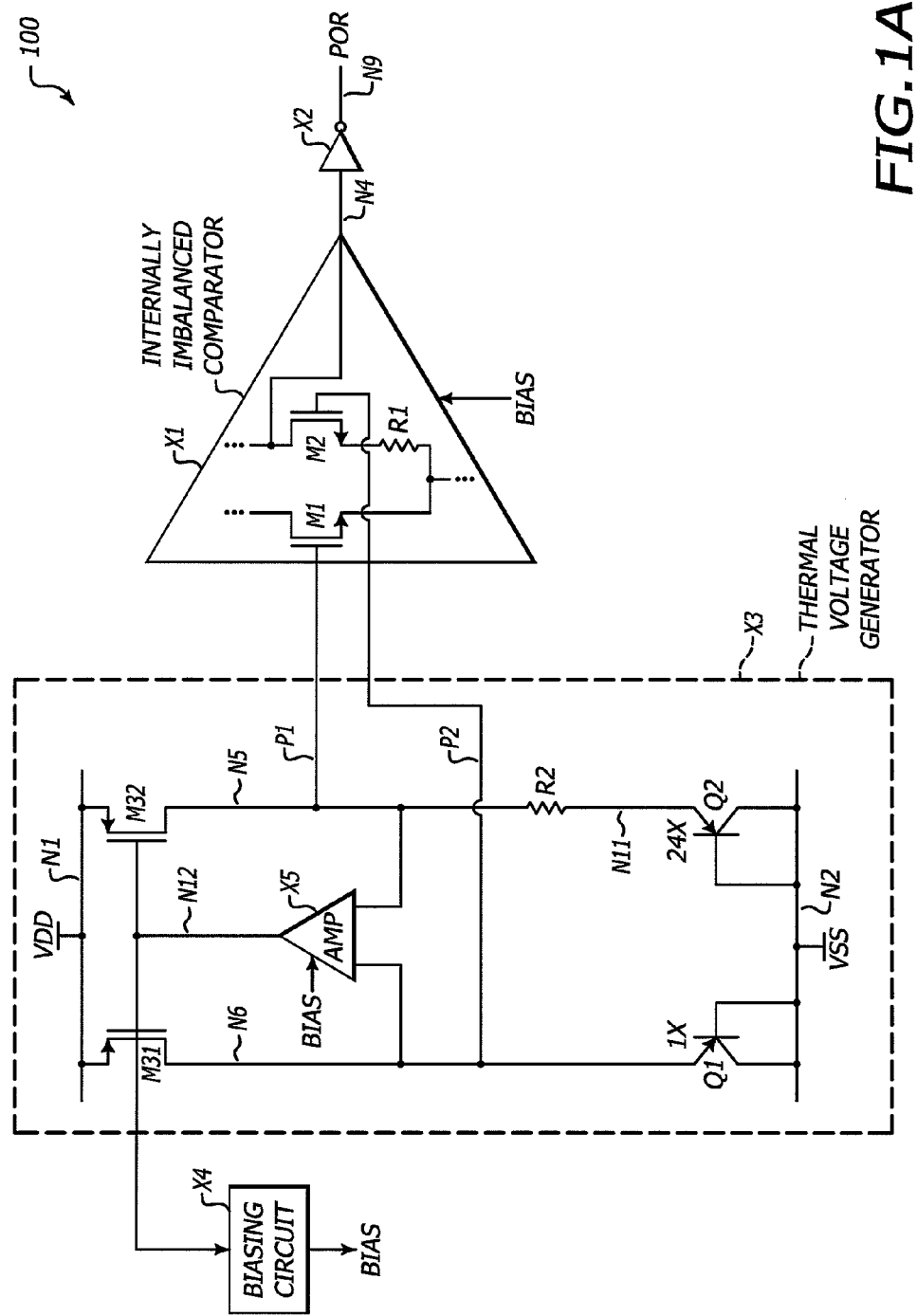
FIGS. 1A and 1B are schematic diagrams illustrating an example circuit that is arranged in accordance with the present disclosure.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electro-magnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity Briefly stated, the present disclosure generally relates to a power-on detection circuit that is arranged to cooperate with a thermal-voltage generator to determine when predictable circuit operation is achieved. The power-on detection circuit includes a comparator circuit and an inverter circuit. A power-on reset (POR) signal is generated by the inverter circuit, which evaluate an output of the comparator circuit. The comparator circuit includes a differential pair arrangement that is imbalanced with a resistor. The differential pair in the comparator circuit is arranged to determine when the thermal voltage has reached a desired target level by evaluating two points within the thermal-voltage generator circuit. The comparator circuit can have a target level that is below 100% of full operation to improve reliability.

Figure 1B:
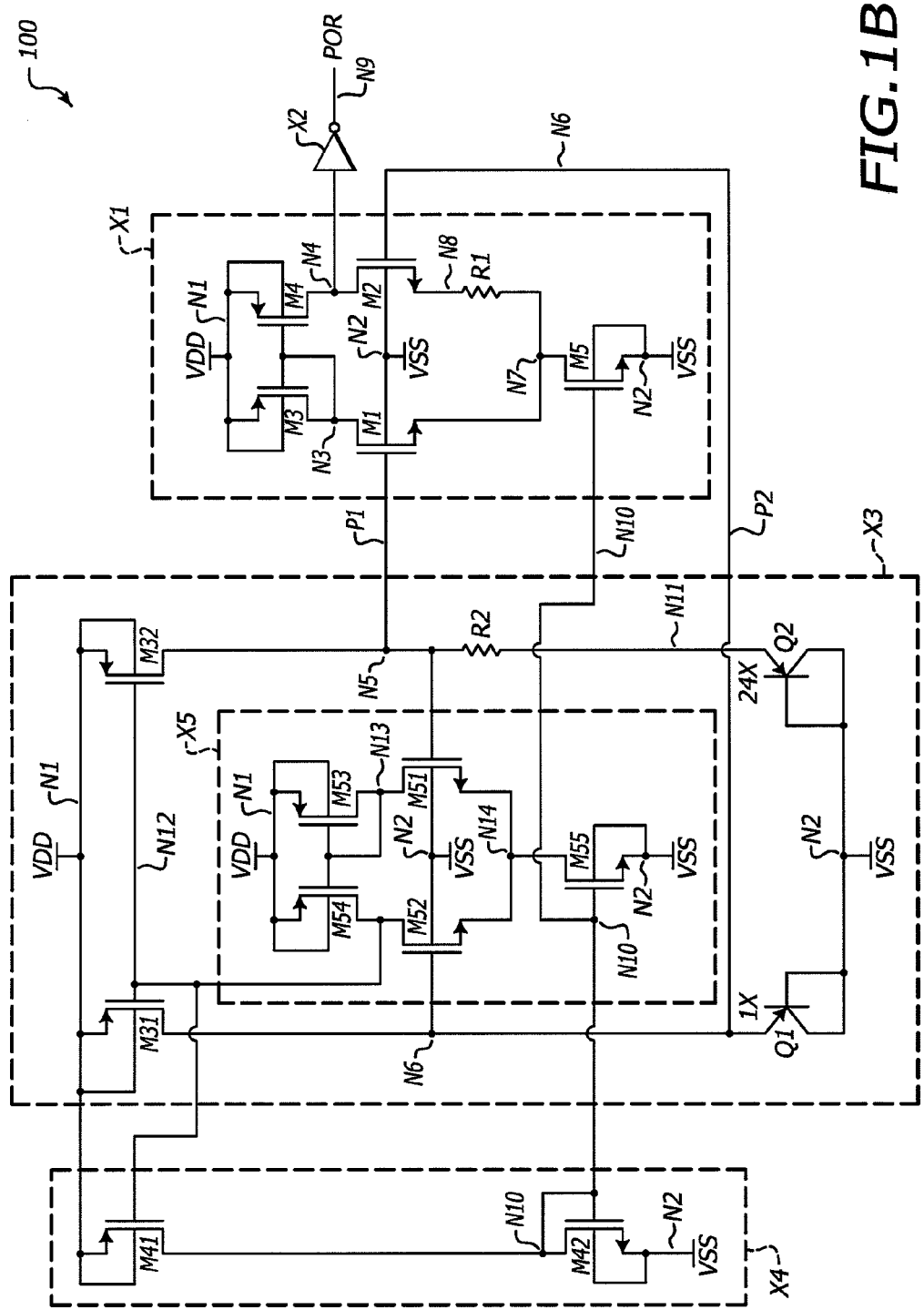

FIGS. 1A and 1B are schematic diagrams illustrating an example circuit (100) that is arranged in accordance with the present disclosure. Circuit 100 includes an imbalanced comparator circuit (X1), an inverter circuit (X2), a thermal-voltage generator circuit (X3), and a biasing circuit (X4). The imbalanced comparator circuit (X1) is coupled to two internal points (P1 and P2) of the thermal-voltage generator circuit (X3), and provides an output that is coupled to an input of the inverter circuit (X2) at node N4. The inverter circuit (X2) is arranged to provide an output signal at node N9, corresponding to POR.

The imbalanced comparator circuit (X1) includes five MOS transistors (M1-M5) and a resistor (R1). Transistor M1 includes a drain coupled to node N3, a gate coupled to node N5 (also referred to as point P1), a source coupled to node N7, and a body coupled to node N2. Transistor M2 includes a drain coupled to node N4, a gate coupled to node N6 (also referred to as point P2), a source coupled to node N8, and a body coupled to node N2. Transistor M3 includes a drain and gate coupled to node N3, and a source and body coupled to node N1. Transistor M4 includes a drain coupled to node N4, a gate coupled to node N3, and a source and body coupled to node N1. Transistor M5 includes a drain coupled to node N7, a gate coupled to node N10, and a source and body coupled to node N2. Resistor R1 is coupled between node N7 and N8.

During operation, transistor M5 operates as a tail current source for a differential pair that is formed by transistors M1 and M2. Transistors M1 and M2 are arranged with resistor R1 such that the division of the tail current from transistor M5 is imbalanced. In other words, the resulting comparator has an inherent input referred offset that is non-zero. The biasing voltage for transistor M5 is derived from thermal-voltage generator circuit X3 via biasing circuit X4. Transistors M3 and M4 are arranged in a common gate configuration to act as loads for transistors M1 and M2. Transistors M1 and M2 can be either matched to one another (e.g., equally sized gate dimensions), or unequally sized. Transistors M3 and M4 can be either matched to one another (e.g., equally sized gate dimensions), or unequally sized. The selection of sizes for transistors M1-M4 are dependent upon the desired amount of offset necessary to trigger the end of the power-on reset condition. In some implementations, resistor R1 can be eliminated where the relative sizes of transistors M1, M2 and M3, M4 are adjusted to provide the same imbalanced effect.

The present disclosure illustrates the imbalanced comparator circuit (X1) with p-type MOS devices for the transistors M3 and M4, and n-type MOS devices for transistors M1, M2 and M5. For this example implementation, node N1 corresponds to an upper power supply voltage (VDD) and node N2 corresponds to a lower power supply voltage (VSS). These example devices were selected based on the available process technology and are not intended to be limiting. In other implementations, the n-type MOS devices are replaced with p-type devices, and vice-versa, where node N1 correspond to the lower power supply voltage (VSS), and where node N2 corresponds to the upper power supply voltage (VDD).

The inverter circuit is illustrated as a simple inverting logic circuit, but can be implemented as other logic functions as may be desired. Moreover, a Schmitt-triggered inverter circuit can be used to provide enhanced performance and noise immunity.

The thermal-voltage generator circuit (X3) is illustrated as an error amplifier circuit (X5), two MOS transistors (M31, M32), two bipolar junction transistors (BJT Q1 and BJT Q2), and a resistor (R2). Transistor M31 includes a drain coupled to node N6, a gate coupled to node N12, and a source and body coupled to node N1. Transistor M32 includes a drain coupled to node N5, a gate coupled to node N12, and a source and body coupled to node N1. Transistor Q1 includes an emitter coupled to node N6, and a base and collector coupled to node N2. Transistor Q2 includes an emitter coupled to node N11, and a base and collector coupled to node N2. The error amplifier includes a first input at node N6, a second input at node N5, and an output at node N12. Resistor R2 is coupled between node N5 and N11. Transistors Q1 and Q2 are illustrated in the figures as vertical substrate PNP devices that can be implemented in many CMOS processes.

The error amplifier circuit (X5) is arranged to compare the voltages at nodes N5 and N6, and drives the gates of transistors M31 and M32 until the voltages at those nodes equalizes at steady-state. Transistors M31 and M32 are arranged to operate as current sources that provide currents to transistors Q1 and Q2 respectively. The operating current densities for transistors Q1 and Q2 are different from one another such that the difference between their base-emitter voltages is impressed across resistor R2. For matched transistors M31 and M32, the difference in current densities for transistors Q1 and Q2 can be accomplished by increasing the emitter area of transistor Q2 relative to transistor Q1 (e.g., 5×, 10×, 20×, 24×, etc.), or by paralleling identical devices to achieve a similar result. For matched transistors Q1 and Q2, the difference in current densities for transistors Q1 and Q2 can be accomplished by scaling the gate areas of transistor M32 relative to transistor M31, or by paralleling identical devices to achieve a similar result. These techniques can also be combined to provide the desired difference in current densities.

As described above, the thermal-voltage generator circuit (X3) is arranged to provide a thermal voltage that depends on the operating currents of the BJTs (namely, transistors Q1 and Q2). As is understood to one of skill in the art, the relationship of the currents and voltages in the thermal generator circuit (X3) can be expressed as follows below:

$$\Delta V_{be} = V_{TV} * \text{LN}\left(\frac{I_{C1}}{I_{C2}} \frac{I_{S2}}{I_{S1}}\right) \quad \text{(Eq. 1)}$$

Where:
$I_{C1}$ is the collector current of Q1.
$I_{C2}$ is the collector current of Q2.
$I_{S1}$ is the reverse-saturation current of Q1 and a function of the area of Q1.
$I_{S2}$ is the reverse-saturation current of Q2 and a function of the area of Q2.

$$V_{TV} = \frac{kT}{q} \text{ is the thermal voltage.} \quad \text{(Eq. 2)}$$

Where:
k is Boltzmann's constant.
T is the absolute temperature in degrees Kelvin.
q is the electron charge.

$$\Delta V_{be} = V_{be1} - V_{be2} \quad \text{(Eq. 3)}$$

Where:
$V_{be1}$ is the base-emitter voltage of Q1.
$V_{be2}$ is the base-emitter voltage of Q2.

The error amplifier circuit (X5) includes five MOS transistors (M51-M55). Transistor M51 includes a drain coupled to node N13, a gate coupled to node N5, a source coupled to node N14, and a body coupled to node N2. Transistor M52 includes a drain coupled to node N12, a gate coupled to node N6, a source coupled to node N14, and a body coupled to node N2. Transistor M53 includes a drain and gate coupled to node N13, and a source and body coupled to node N1. Transistor M54 includes a drain coupled to node N12, a gate coupled to node N13, and a source and body coupled to node N1. Transistor M55 includes a drain coupled to node N14, a gate coupled to node N10, and a source and body coupled to node N2. Transistor M55 is arranged to operate as a current source for the differential pair formed by transistors M51 and M52. Transistors M53 and M54 are arranged as a current mirror, that acts as an active load for the differential pair.

The present disclosure admits of p-type transistor devices for transistors Q1, Q2, M31, M32, M53 and M54, and n-type transistor devices for transistors M51, M52 and M55 as illustrated in FIGS. 1A and 1B. For this example implementation, node N1 corresponds to an upper power supply voltage (VDD) and node N2 corresponds to a lower power supply voltage (VSS). These example devices were selected based on the available process technology and are not intended to be limiting. In other implementations, the n-type transistor devices are replaced with p-type devices, and vice-versa, where node N1 correspond to the lower power supply voltage (VSS), and where node N2 corresponds to the upper power supply voltage (VDD).

The biasing circuit (X4) includes two MOS transistors (M41 and M42). Transistor M41 includes a drain coupled to node N10, a gate coupled to node N12, and a source and body coupled to node N1. Transistor M42 includes a drain and gate coupled to node N10, and a source and body coupled to node N2. Node N12 is arranged as an input terminal that is controlled by the error amplifier circuit (X5), while node N10 is arranged as an output terminal that is used as a common biasing control.

After power is applied across nodes N1 and N2, the circuits will begin to operate with various transients occurring. The error-amplifier circuit (X5) will attempt to force the currents in transistors M31 an M32 until the voltages at nodes N5 and N6 begin to equalize. The comparator circuit (X1) is arranged to determine when the thermal-voltage generator has reached a trigger level that indicates a stable operating. The comparator circuit (X1) determines whether the trigger level has been achieved by comparing points P1 and P2 (in this example, nodes N5 and N6) in the thermal-voltage generator circuit (X3). Since the trigger level may vary over process variations and temperature variations, a 100% target may be an unreliable target. As such, the offset in the comparator can be configured to provide an offset relative to the 100% trigger level, such as for example 80% or 90%, etc. of the final thermal voltage at steady-state. At the trigger point node N4 will transition to a high level (e.g., around VDD) and node N9 will transition to a logic low.

The trigger level can be set as a relatively high percentage of the bias to ensure that all circuits can properly function (e.g., current sources are biased in active operation, amplifiers function properly, etc.) when the POR signal is de-asserted. Since the POR signal is dependent upon the actual biasing circuits instead of conventional techniques that are simply based on the power-supply voltages, the POR signal is less likely to end premature to stable operation. The described implementation also operates on relatively lower currents when compared to conventional POR circuits that used power-supply voltage detectors.

Figure 2A:
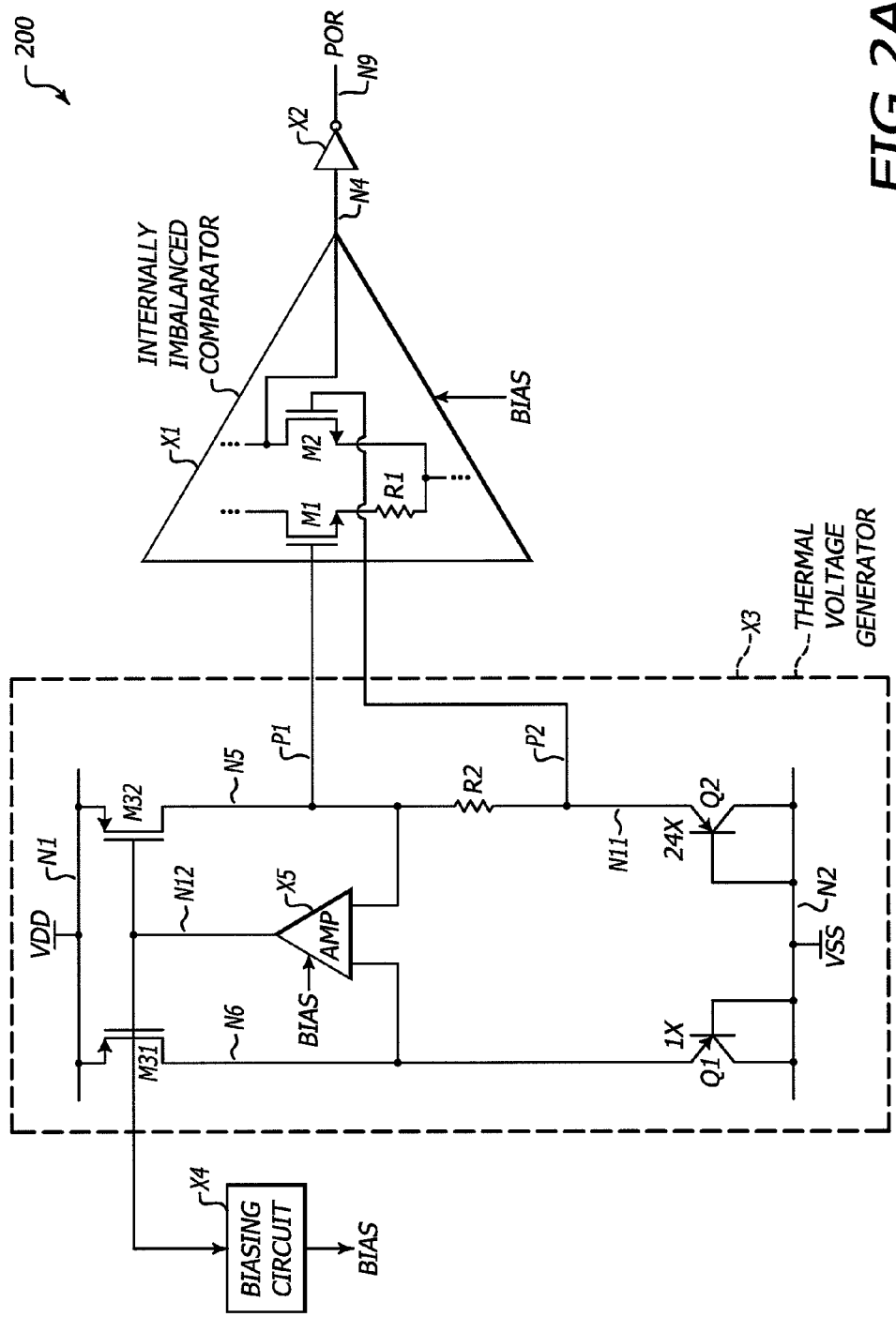
FIGS. 2A and 2B are schematic diagrams illustrating another example circuit that is arranged in accordance with the present disclosure.
Figure 2B:
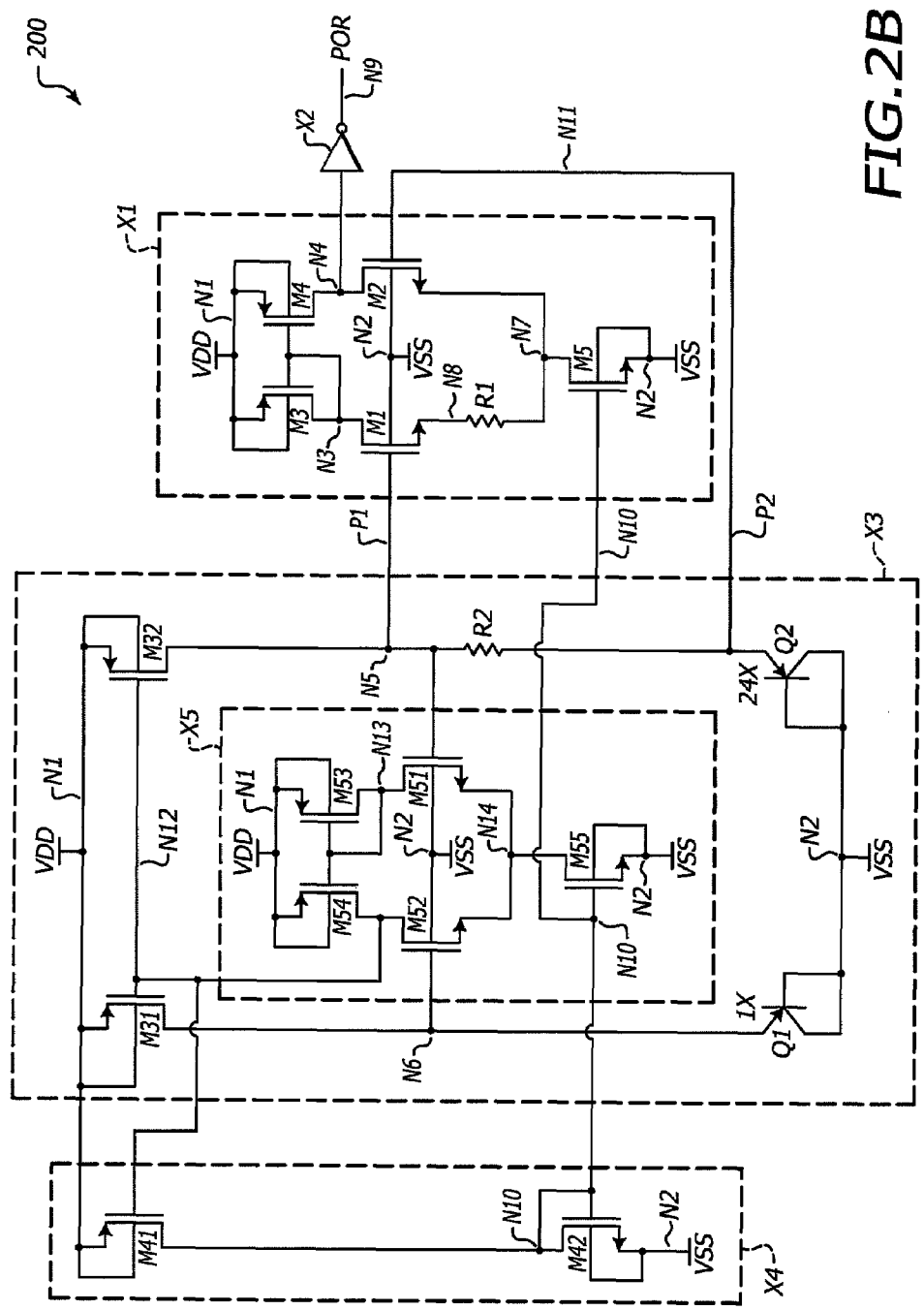

FIGS. 2A and 2B are schematic diagrams illustrating another example circuit (200) that is arranged in accordance with the present disclosure. Circuit 200 also includes an imbalanced comparator circuit (X1), an inverter circuit (X2), a thermal-voltage generator circuit (X3), and a biasing circuit (X4). The imbalanced comparator circuit (X1) is again coupled to two internal points (P1 and P2) of the thermal-voltage generator circuit (X3), and provides an output that is coupled to an input of the inverter circuit (X2) at node N4. The inverter circuit (X2) is arranged to provide an output signal at node N9, corresponding to POR.

Circuit 200 is substantially similar to circuit 100, where the inverter circuit (X2), the thermal-voltage generator circuit (X3), and the biasing circuit (X4) are configured identically. Point P1 is identical for circuits 100 and 200, while point P2 is now moved to node N11, which is a different internal point for the thermal-voltage generator circuit (X3). Also, the imbalanced comparator circuit (X1) is substantially the same for circuits 100 and 200, except that resistor R1 is now moved to a different position within the circuit. In particular, resistor R1 is coupled between the source of transistor M1 (now node N8) and the tail current source at node N7 instead of to the source of transistor M2. In some implementations, resistor R1 can be eliminated where the relative sizes of transistors M1, M2 and M3, M4 are adjusted to provide the same imbalanced effect.

Circuits 100 and 200 both include an imbalanced comparator circuit that is arranged to evaluate two internal points from the thermal-voltage generator circuit. While the two internal points are different for both implementations, the principals of operation are substantially similar.

The circuits described herein work over a wide range of power supply voltages with low quiescent currents (e.g., 100 nA range) in a space efficient solution (e.g., the long channel devices eliminate the need for a large resistor). Moreover, the topology is useful at low power-supply voltages (e.g., below 2V) as well as increased power-supply voltages (e.g., above 5V). The topology also functions well over process variations as well as over varied temperature ranges (e.g., −50 deg. C. to 150 deg. C.).

Although the invention has been described herein by way of exemplary embodiments, variations in the structures and methods described herein may be made without departing from the spirit and scope of the invention. For example, the positioning of the various components may be varied. Individual components and arrangements of components may be substituted as known to the art. Since many embodiments of the invention can be made without departing from the spirit and scope of the invention, the invention is not limited except as by the appended claims.

What is claimed is:

1. An apparatus that is arranged to cooperate with a thermal-voltage generator circuit to assert a power-on reset (POR) signal during a start-up transient condition, wherein the thermal-voltage generator circuit includes a first bipolar junction device, a second bipolar junction device, and a resistor, the apparatus comprising:

an imbalanced comparator circuit comprising a first MOS transistor, a second MOS transistor and a current source are arranged to cooperatively operate as a differential pair with an intentional input referred offset, wherein a gate of the first MOS transistor is coupled to a first internal point of the thermal-voltage generator circuit, a gate of the second MOS transistor is coupled to a second internal point of the thermal-voltage generator circuit, and a drain of the second MOS transistor is arranged as an output of the imbalanced comparator circuit; and an inverter circuit that is arranged to generate the POR signal responsive to the output of the imbalanced comparator circuit, wherein the cooperative operation of the imbalanced comparator circuit and the inverter circuit are arranged to evaluate the start-up transient condition such that the POR signal is asserted during the start-up transient condition until the thermal-voltage generator circuit is detected as reaching a target operating condition for stable operation.

2. The apparatus of claim 1, the imbalanced comparator circuit further comprising a second resistor that is coupled between a source of the first MOS transistor and the current source, wherein a source of the second MOS transistor is also coupled to the current source.

3. The apparatus of claim 1, the imbalanced comparator circuit further comprising a current mirror circuit that is coupled to a drain of the first MOS transistor and a drain of the second MOS transistor such that the first and second MOS transistors have matched currents, wherein the first MOS transistor is sized larger than the second MOS transistor.

4. The apparatus of claim 1, the imbalanced comparator circuit further comprising a current mirror circuit that is coupled to a drain of the first MOS transistor and a drain of the second MOS transistor such that the first and second MOS transistors have different operating currents, wherein the first MOS transistor is matched to the second MOS transistor.

5. The apparatus of claim 1, the imbalanced comparator circuit further comprising a current mirror circuit that is coupled to a drain of the first MOS transistor and a drain of the second MOS transistor such that the first and second MOS transistors have different operating currents, wherein the first MOS transistor is sized larger than the second MOS transistor.

6. The apparatus of claim 1, the imbalanced comparator circuit further comprising:

a third MOS transistor that includes a gate and a drain coupled to a third node, and a source coupled to a first node, wherein the third node corresponds to a drain of the first MOS transistor;

a fourth MOS transistor that includes a gate coupled to the third node, a drain coupled to a fourth node, and a source coupled to the first node, wherein the fourth node corresponds to a drain of the second MOS transistor; and a second resistor that is coupled between a fifth node and a sixth node, wherein the fifth node corresponds to a source of the second MOS transistor, and wherein the sixth node correspond to a junction of the current source and a source of the first MOS transistor.

7. The apparatus of claim 1, the imbalanced comparator circuit further comprising:

a third MOS transistor that includes a gate and a drain coupled to a third node, and a source coupled to a first node, wherein the third node corresponds to a drain of the first MOS transistor;

a fourth MOS transistor that includes a gate coupled to the third node, a drain coupled to a fourth node, and a source coupled to the first node, wherein the fourth node corresponds to a drain of the second MOS transistor; and a second resistor that is coupled between a fifth node and a sixth node, wherein the fifth node corresponds to a source of the second MOS transistor, and wherein the sixth node correspond to a junction of the current source and a source of the first MOS transistor.

8. The apparatus of claim 1, wherein the first internal point is coupled to an emitter terminal of the second bipolar junction device through the resistor, and the second internal point corresponds to an emitter terminal of the first bipolar junction device.

9. The apparatus of claim 1, wherein the first internal point is coupled to an emitter terminal of the second bipolar junction device though the resistor, and the second internal point corresponds to the emitter terminal of the second bipolar junction device.

10. The apparatus of claim 1, wherein the inverter circuit is a Schmitt trigger.

11. An apparatus that is arranged to cooperate with a thermal-voltage generator circuit to assert a power-on reset (POR) signal during a start-up transient condition, the apparatus comprising:

a thermal-voltage generator circuit comprising:

an error amplifier that includes a first input coupled to a sixth node, a second input coupled to a fifth node, and an output coupled to a twelfth node;

a first current source that is coupled to the sixth node, wherein the first current source is biased by the output of the error amplifier at the twelfth node;

a second current source that is coupled to the fifth node, wherein the second current source is biased by the output of the error amplifier at the twelfth node;

a resistor that is coupled between the fifth node and an eleventh node;

a first bipolar junction device that is coupled to the sixth node;

a second bipolar junction device that is coupled to the eleventh node;

an imbalanced comparator circuit arranged in cooperation with the thermal-voltage generator circuit, the imbalanced comparator circuit comprising:

a first MOS transistor that includes a drain coupled to a third node, a gate coupled to the fifth node, and a source coupled to a seventh node;

a second MOS transistor that includes a drain coupled to a fourth node, a gate coupled to the sixth node, and a source coupled to the seventh node;

a third MOS transistor that includes a drain and a gate coupled to the third node, and a source coupled to a first node;

a fourth MOS transistor that includes a drain coupled to the fourth node, a gate coupled to the third node, and a source coupled to the first node; and a fifth MOS transistor that includes a drain coupled to the seventh node, a gate coupled to a tenth node, and a source coupled to a second node, wherein the imbalanced comparator circuit is arranged with an internal imbalance between the first MOS transistor and the second MOS transistor resulting in an input referred offset; and an inverter circuit that includes an input coupled to the fourth node, wherein the inverter circuit is arranged to cooperate with the imbalanced comparator circuit and such that the POR signal is asserted during the start-up transient condition until the thermal-voltage generator circuit is detected as reaching a target operating condition for stable operation.

12. The apparatus of claim 11, the imbalanced comparator circuit further comprising a second resistor, wherein the source of the second MOS transistor is coupled to the seventh node through the second resistor.

13. The apparatus of claim 11, wherein the target operating condition corresponds to less than 100% of the steady-state condition for the thermal-voltage generator circuit.

14. The apparatus of claim 11, further comprising a biasing circuit that includes an input that is coupled to the output of the error amplifier, wherein the biasing circuit is arranged to bias the gate of the fifth MOS transistor.

15. The apparatus of claim 14, the biasing circuit comprising:

a sixth MOS transistor that includes a drain that is coupled to the tenth node, a gate that is coupled to a twelfth node, and a source that is coupled to the first node, wherein the twelfth node corresponds to the output of the error amplifier; and a seventh MOS transistor that includes a drain and a gate coupled to the tenth node, and a source coupled to the second node.

16. The apparatus of claim 14, the biasing circuit comprising:

a sixth MOS transistor that includes a drain that is coupled to the tenth node, a gate that is coupled to a twelfth node, and a source that is coupled to the first node, wherein the twelfth node corresponds to the output of the error amplifier; and a seventh MOS transistor that includes a drain and a gate coupled to the tenth node, and a source coupled to the second node.

17. An apparatus that is arranged to cooperate with a thermal-voltage generator circuit to assert a power-on reset (POR) signal during a start-up transient condition, the apparatus comprising:

a thermal-voltage generator circuit comprising:

an error amplifier that includes a first input coupled to a sixth node, a second input coupled to a fifth node, and an output coupled to a twelfth node;

a first current source that is coupled to the sixth node, wherein the first current source is biased by the output of the error amplifier at the twelfth node;

a second current source that is coupled to the fifth node, wherein the second current source is biased by the output of the error amplifier at the twelfth node;

a resistor that is coupled between the fifth node and an eleventh node;

a first bipolar junction device that is coupled to the sixth node;

a second bipolar junction device that is coupled to the eleventh node;

an imbalanced comparator circuit arranged in cooperation with the thermal-voltage generator circuit, the imbalanced comparator circuit comprising:

a first MOS transistor that includes a drain coupled to a third node, a gate coupled to the fifth node, and a source coupled to a seventh node;

a second MOS transistor that includes a drain coupled to a fourth node, a gate coupled to the eleventh node, and a source coupled to the seventh node;

a third MOS transistor that includes a drain and a gate coupled to the third node, and a source coupled to a first node;

a fourth MOS transistor that includes a drain coupled to the fourth node, a gate coupled to the third node, and a source coupled to the first node; and a fifth MOS transistor that includes a drain coupled to the seventh node, a gate coupled to a tenth node, and a source coupled to a second node, wherein the imbalanced comparator circuit is arranged with an internal imbalance between the first MOS transistor and the second MOS transistor resulting in an input referred offset; and an inverter circuit that includes an input coupled to the fourth node, wherein the inverter circuit is arranged to cooperate with the imbalanced comparator circuit and such that the POR signal is asserted during the start-up transient condition until the thermal-voltage generator circuit is detected as reaching a target operating condition for stable operation.

18. The apparatus of claim 17, the imbalanced comparator circuit further comprising a second resistor, wherein the source of the first MOS transistor is coupled to the seventh node through the second resistor.

19. The apparatus of claim 17, wherein the target operating condition corresponds to less than 100% of the steady-state condition for the thermal-voltage generator circuit.

20. The apparatus of claim 17, further comprising a biasing circuit that includes an input that is coupled to the output of the error amplifier, wherein the biasing circuit is arranged to bias the gate of the fifth MOS transistor.

* * * * *